(12) United States Patent
Charpentier et al.

(10) Patent No.: US 9,490,798 B1
(45) Date of Patent: Nov. 8, 2016

(54) GATE DRIVE CONTROL SYSTEM FOR SIC AND IGBT POWER DEVICES

(71) Applicant: AgileSwitch, LLC, Philadelphia, PA (US)

(72) Inventors: Albert J. Charpentier, Malvern, PA (US); Alan K. Smith, Phoenixille, PA (US); Nitesh Satheesh, Bensalem, PA (US); Robin Weber, Philadelphia, PA (US)

(73) Assignee: AgileSwitch, LLC, Philadelphia, PA (US)

( * ) Notice: Subject to any disclaimer, the term of this patent is extended or adjusted under 35 U.S.C. 154(b) by 0 days.

(21) Appl. No.: 15/074,364

(22) Filed: Mar. 18, 2016

Related U.S. Application Data

(60) Provisional application No. 62/244,325, filed on Oct. 21, 2015.

(51) Int. Cl.
*H03K 17/60* (2006.01)
*H03K 17/567* (2006.01)
*H03K 17/687* (2006.01)

(52) U.S. Cl.
CPC .......... *H03K 17/567* (2013.01); *H03K 17/687* (2013.01)

(58) Field of Classification Search
None
See application file for complete search history.

(56) References Cited

U.S. PATENT DOCUMENTS

| | | | |
|---|---|---|---|
| 4,777,579 A | 10/1988 | Jahns | |
| 8,984,197 B2 | 3/2015 | Charpentier | |
| 2007/0200602 A1* | 8/2007 | Ishikawa | H03K 17/0406 327/110 |
| 2008/0122497 A1 | 5/2008 | Ishikawa | |
| 2011/0169549 A1 | 7/2011 | Wu | |
| 2012/0013371 A1 | 1/2012 | Nakatake | |
| 2015/0162905 A1* | 6/2015 | Wagoner | H03K 17/0412 327/432 |
| 2015/0311692 A1* | 10/2015 | Hiyama | H03K 17/0828 361/31 |
| 2016/0182034 A1* | 6/2016 | Wagoner | H02M 1/08 327/432 |

OTHER PUBLICATIONS

Domes et al., "IGBT-Module Integrated Current and Temperature Sense Features Based on Sigma-Delta Converter", Infineon Technologies, 2009.
Motto et al., "IGBT Module with User Accessible On-Chip Current and Temperature Sensors", IEEE, 2012, pp. 176-181.

* cited by examiner

*Primary Examiner* — Long Nguyen
(74) *Attorney, Agent, or Firm* — RatnerPrestia

(57) ABSTRACT

A gate-drive controller for a power semiconductor device includes a master control unit (MCU) and a comparator that compares output signal of the power semiconductor device to a reference value generated by the MCU. The MCU, in response to a turn-off trigger signal, generate a first intermediate drive signal for the power semiconductor device and generates a second intermediate drive signal, different from the first drive signal, when a DSAT signal indicates that the power semiconductor device is experiencing de-saturation. The MCU generates a final drive signal for the power semiconductor when the output signal of the comparator indicates that the output signal of the power semiconductor device has changed relative to the reference value.

15 Claims, 8 Drawing Sheets

US 9,490,798 B1

GATE DRIVE CONTROL SYSTEM FOR SIC AND IGBT POWER DEVICES

BACKGROUND OF THE INVENTION

Power Semiconductor Devices, IGBTs (Insulated Gate Bipolar Transistors) or FETs (Field Effect Transistors) based on silicon (Si), silicon carbide (SiC) Gallium Nitride (GaN) and other Wide Bandgap materials (WBGs) such as diamond, aluminum nitride (AlN), and boron nitride (BN), are used in high power inverters, motor control, battery control systems, etc. SiC and GaN FETs are becoming a popular option for high power systems. These wide band gap devices have faster switching speeds and are more efficient than Si IGBTs. The improved efficiency is a result of the faster switching speed. Faster switching reduces the switching losses and, by switching at a higher frequency, smaller inductors and capacitors can be used than would be used for devices having lower switching speeds. The combination of lower losses and smaller external filter components makes SiC devices an attractive alternative to the IGBT.

SUMMARY

In one embodiment, a gate-drive controller for a power semiconductor device includes a master control unit (MCU) and a comparator that compares an output signal of the power semiconductor device to a reference value. The MCU, in response to a turn-off trigger signal, generate the reference value and a first intermediate drive signal for the power semiconductor device. The MCU generates a different reference value and a different intermediate drive signal when a DSAT signal indicates that the power semiconductor device is experiencing de-saturation. The MCU generates a final drive signal for the power semiconductor when the comparator indicates that the output signal from the power semiconductor device is less than the reference value.

In another embodiment, a gate-drive controller includes an MCU that generates a first drive signal for the power semiconductor device when a trigger signal indicates that the power semiconductor device is to be turned off, holds the first drive signal for a first predetermined time interval, provides a second drive signal, different from the first drive signal, at the end of the first predetermined time interval, holds the second drive signal for a second predetermined time, and provides a third drive signal, different from the first and second drive signals, at the end of the second predetermined time interval.

In yet another embodiment, The MCU receives a trigger pulse having a rising edge and a falling edge. In response to detecting the rising edge of the trigger pulse, the MCU generates a first reference value and a first drive signal to partially turn-on the power semiconductor device. When the output signal of the comparator changes state, the MCU generates a second drive signal to fully turn on the power semiconductor device. In response to the falling edge of the trigger pulse, the MCU generates a second reference value and a third drive signal for the power semiconductor device to turn the power semiconductor device partially off. When the output signal of the comparator changes back to its original state, the MCU generates a fourth drive signal to turn fully turn off the power semiconductor device.

DETAILED DESCRIPTION OF THE INVENTION

The higher switching speed of the SiC devices may create a control problem. The fast turn-on and turn-off time coupled with the stray inductance of the system may result in relatively high-voltage switching spikes when the devices are turned off and ringing on the output voltage signals when they are turned on. The spikes and ringing are directly related to the inductance, L, in the system ($V=L*dI/dt$). For example a power semiconductor device that switches 200 Amps in 50 ns with only 50 nH of inductance may create a 200V spike. This large a spike may limit the usefulness of the SiC device.

Figure 1A:
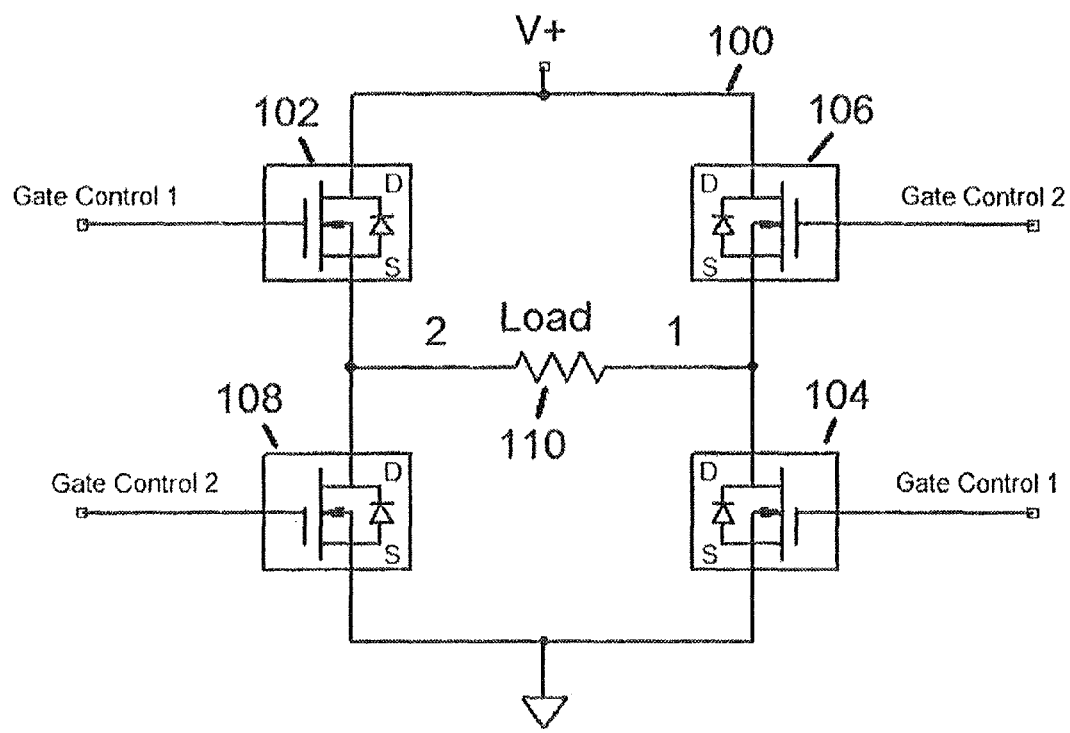
FIG. 1A is a schematic diagram of a bridge circuit including four power FETs.
Figure 1B:
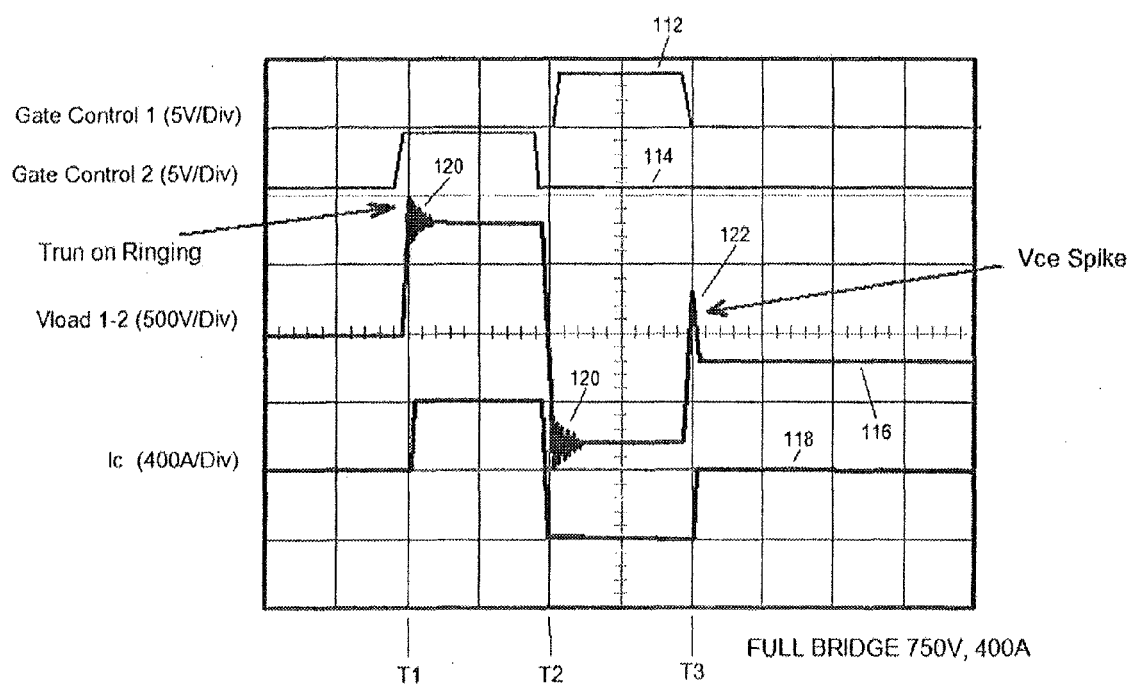
FIG. 1B is a graph showing waveforms of voltage versus time and current versus time that is useful for describing the operation of the circuit shown in FIG. 1A.

FIGS. 1A and 1B show turn-on ringing and turn-off spikes across the load of a bridge circuit. The circuit 100 shown in FIG. 1A includes four power FETs, 102, 104, 106 and 108 arranged as a bridge circuit to provide power to a load, illustrated as a resistor 110. FETs 102 and 104 are controlled by a voltage gate control 1 while FETs 106 and 108 are controlled by a voltage gate control 2. FIG. 1B is a graph showing gate control 1 (112), gate control 2 (114), the voltage across the load (116) and the current through the load (118). At time T1, gate control 2 transitions to high, turning on FETs. 106 and 108. This causes current to flow through the load from terminal 1 to terminal 2. As shown, the rapid switching also causes ringing 120 on the voltage across the load. This ringing is caused by parasitic inductance in the circuit. At time. T2, gate control 2 transitions to low and gate control 1 transitions to high. This switches off FETs 106 and 108 and switches on FETs 102 and 104, causing current to flow through the load in the reverse direction, from terminal 2 to terminal 1. This switching also generates ringing 120 at time 2 in the voltage across the load. At time T3, gate control 1 transitions to low, turning off FETs 102 and 104, switching off the current to the load 110. The switching off of the current causes a spike 122 in the voltage across the load 110.

Existing systems use a resistor to reduce the gate charging current and, thus, slow down the switching time of the SiC device to reduce the spikes and ringing. Unfortunately slowing down the switch time over the entire switching period dramatically reduces the efficiency of the system. A solution is needed to control and optimize the switching speed to maintain efficiency while reducing turn-off voltage spikes and turn-on ringing.

While the example control circuits are shown as using SiC power FETs, it is contemplated that they may be used with other types of power FETs or with IGBT power semiconductors. Consequently, as used herein, the term Vce, which refers to the voltage across the power semiconductor device refers to the collector-to-emitter voltage of an IGBT or to the source-to-drain voltage of a power FET. Similarly, the term Ic refers to the current flowing through the conductive channel of the device which may be the collector current of the IGBT or the source current of the power FET. This current may be measured at either the collector or emitter of the IGBT or at the source or drain of the power FET.

One way to manage the high voltage turn-off spike is to turn the devices off in two levels. This is referred to herein as two-level turn-off (2LTOff). A system that implements 2LTOff first drives the gate of the power semiconductor device to an intermediate voltage level and, after a predetermined interval or when a predetermined Vce or Ic value is measured, drives the gate to its final off voltage state. The purpose of this function is to increase the dynamic on-resistance of the FET to reduce the current flowing through the device and, thus, to reduce dI/dt and the magnitude of the spike. The use of 2LTOff allows the user to improve the switching characteristics for the best tradeoff between efficiency and voltage turn-off spike.

Figure 2:
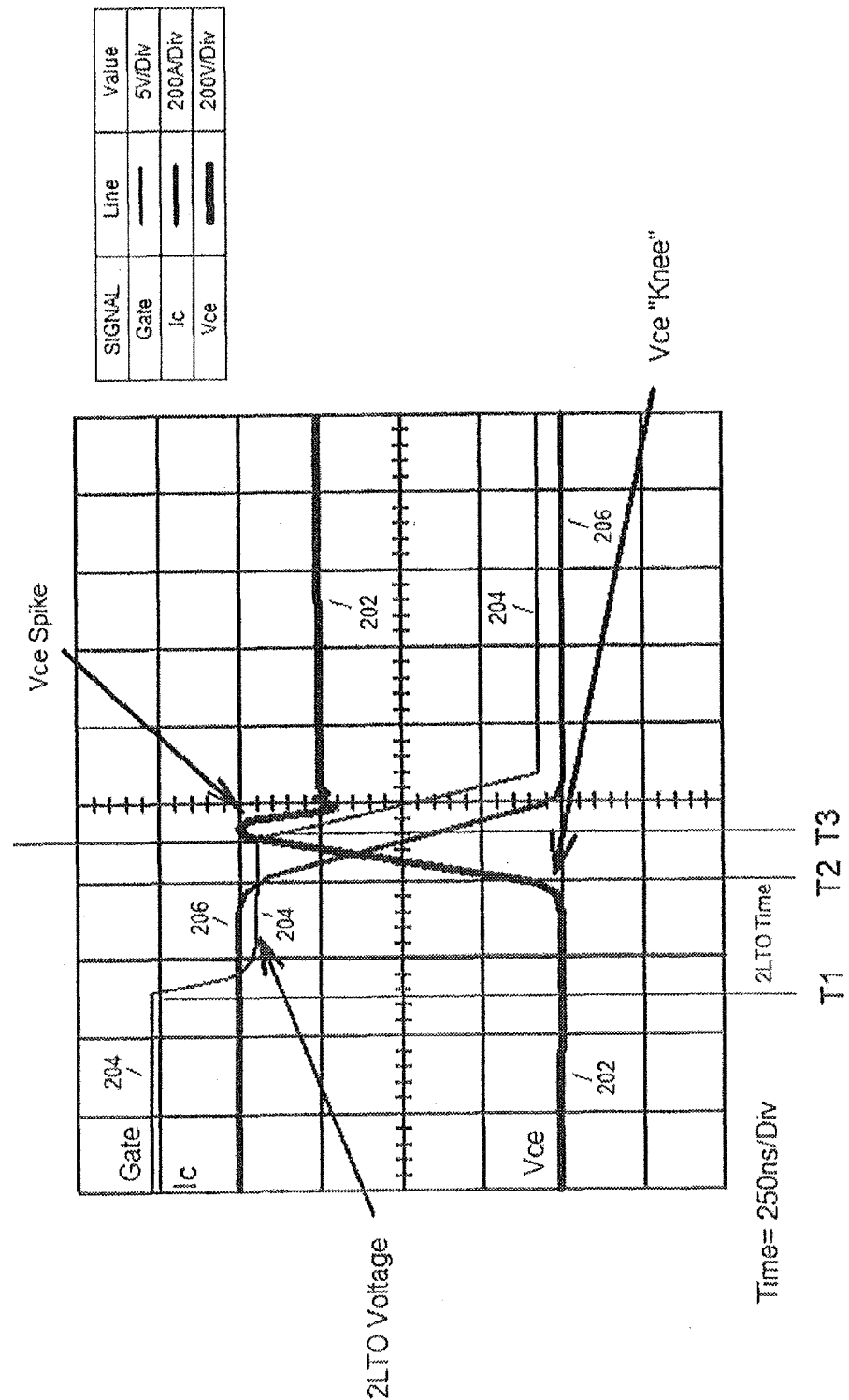
FIGS. 2 and 3 are graphs showing waveforms of voltage versus time and current versus time that is useful for describing example control circuits.

FIG. 2 shows example waveforms occurring during a 2LTOff operation. Before time T1, the gate voltage 204 is high and the device is turned on. The current, Ic 206, flowing through the device is high and the voltage across the device, Vce 202, is low. At time T1, the gate voltage 204 drops to an intermediate value, 2LTO, which increases the dynamic on-resistance of the device. The 2LTO voltage level is held on the gate for a 2LTO time which ends at T3. At time T3, the gate voltage transitions 204 to its low value. Shortly after time T2, the FET turns off resulting in a voltage spike 202 on the Vce signal. At T2, before the end of the 2LTO time, Vce begins to rise (Vce knee). As described below, this rise in Vce may be detected by a comparator to cause the MCU to apply the turn-off gate voltage before the end of the 2LTO time.

Figure 3:
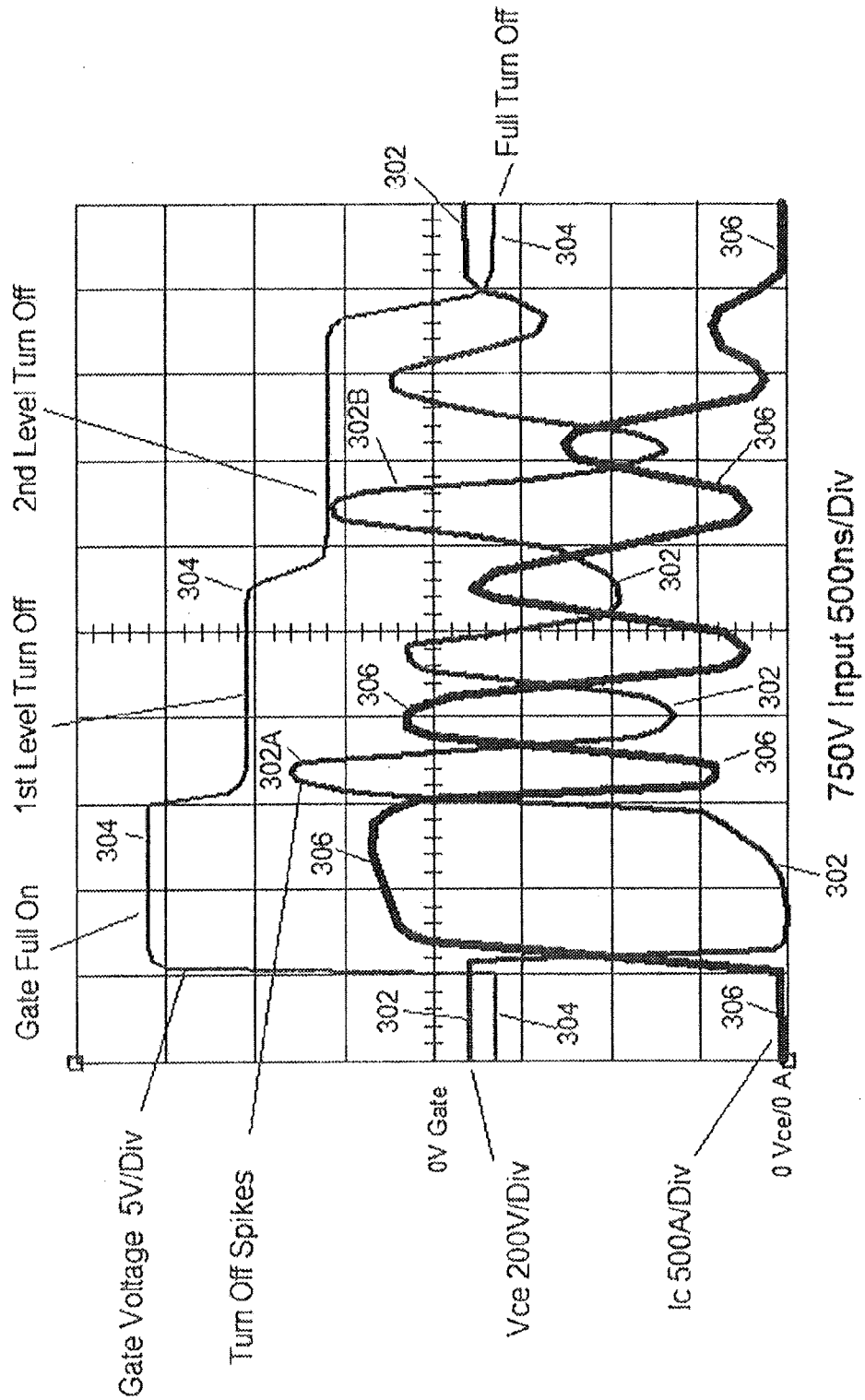

As an alternative to the two-level turn-off or turn-on, a multi-level turn or turn-on and/or turn-off (MLTO) may provide even better spike and ring suppression. In a multi-level method, the gate voltage is changed in three or more steps. This is illustrated in FIG. 3. In this example, the gate voltage 304 controls the device as shown by the graphs of Vce 302 and Ic 306. As shown, before time T0, the gate voltage 304 is low and the device is turned off (Vce 302 is high and Ic 306 is low). At time T0, the gate voltage transitions to high, turning on the device. At time T1, the gate voltage drops to its first intermediate level, resulting in a voltage spike 302A on the Vce signal 302. This first intermediate level is held for a first time interval from T1 to T2, and, at T2, the gate voltage is reduced to a second intermediate level. This results in a second voltage spike 302B, after time T2. After a second hold time, between time T2 and T3, the gate voltage transitions to low and the device is turned off. It is noted that there is no voltage spike following time T3. Furthermore, the voltage spikes 302A and 302B are much smaller than if the gate voltage had transitioned from high to low in a single step.

In power systems failure often occurs as a short circuit, this type of failure results in a condition in the FET referred to as de-saturation (DSAT). A power semiconductor experiencing DSAT falls out of saturation due to a rapid increase in current in the device. A DSAT condition may result in an increase in Vce above the normal Vce level when the device is turned on. This causes the power dissipated by the device, and thus the heat, to rise. Once a DSAT condition is detected, the device must be turned off quickly to avoid damage. It may be difficult to rapidly turn off the power semiconductor device, however, without generating a large voltage spike because of the high level of current flowing through the device.

Two solutions may be used to combat DSAT. One is to increase the gate resistance even more to attempt to manage the voltage spike while the other is to use 2LTOff to shut down the device. Increasing the gate resistance, however, further reduces the power efficiency of the device during normal operation. If 2LTOff is already used to control the turn off spike in normal operation it may not be effective to control the spike in a DSAT condition. One solution may be to use a gate resistor to control the turn off voltage spike during normal operation and use 2LTOff to turn the device off when a DSAT condition is detected. The example apparatus and method described below allows two types of turn-off functions, one set of parameters (the intermediate voltage and time) may be used during normal operation and a second set of parameters (for higher voltage and time) during a DSAT event.

A third solution is to use two sets of multi-level turn off (MLTOff) parameters for both normal operation and for a DSAT condition. Note that 2LTOff is a subset of Multi-Level turn off which uses two or more intermediate levels during a turn-off operation. The apparatus described below may be used to implement a solution employing a set of two multi-Level turn off parameters. During DSAT, a multi-level solution employing more than two levels may be the best solution to effectively manage the magnitude of the dI/dt, and, thus, the magnitude of the voltage spike.

Two-level turn-on (2LTOn) is similar to 2LTOff, allowing a power semiconductor device to be turned on quickly without generating high-voltage ringing. The FET gate signal is first turned on to an intermediate level, it remains at that level for a time interval, and then changes to the final voltage level at which the device is turned fully on.

Some of the systems and methods described below also add real time monitoring of Vce to manage the timing for the switching characteristics of the SiC or IGBT device for both 2LTOff and 2LTOn (as used herein, the term 2LTO can refer to either 2LTOn or 2LTOff). Two-level turn-on (2LTOn) is similar to 2LTOff except that it is used during turn on. Other systems and methods monitor current or detect Vce overshoot.

Vce Monitoring

The main purpose of the 2LTO function is to allow the FET to change the on/off resistance gradually at the beginning of the switching cycle to reduce or manage dV/dt and dI/dt. As can be seen in FIG. 2, Vce begins to move slightly higher (the resistance of the FET increases) during the 2LTO period. This is shown in FIG. 2 as the "Vce knee." This initial soft change allows the amperage in the stray inductance to change more gradually and the effect is that the turn off spike is reduced.

Figure 4:
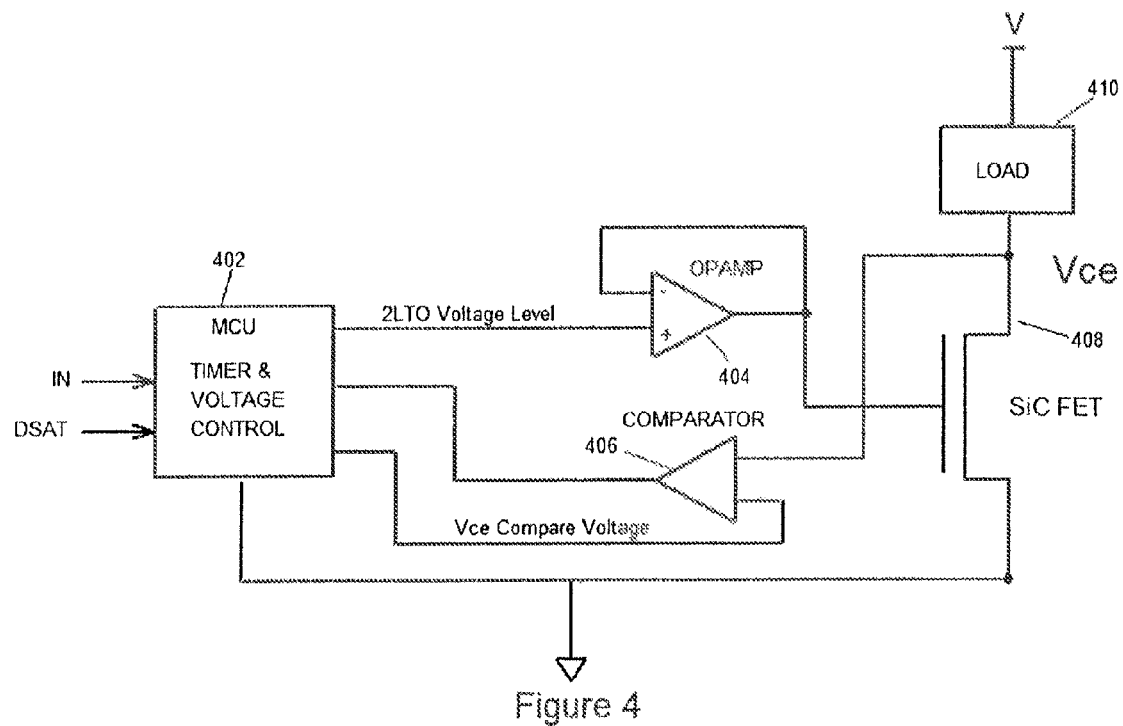
FIG. 4 is a schematic diagram of an example control circuit that controls switching based on Vce.

One method for controlling the 2LTO function to monitor the Vce of the FET using a comparator 406 as shown in FIG. 4. In this system, a master control unit (MCU) 402 receives an input signal IN that goes high when the FET is to be turned on and goes low when the FET is to be turned off. The signal IN may be a digital signal or an analog signal. In addition, the MCU receives a Boolean signal from the comparator 406 and generates a 2LTO analog voltage level that is applied to an operational amplifier (op amp) driver 404 which, in turn, provides the gate voltage to the SiC FET 408. The MCU 402 also generates a reference analog voltage level Vce Compare, that is applied to one input terminal of the comparator 406. The other input terminal of the comparator is coupled to the source terminal of the FET 408 to monitor the Vce level. As shown in FIG. 4, the source terminal of the FET 408 is connected to a load 410, that receives operational power from a voltage source, V. When the Vce level equals or exceeds the Vce Compare value, the comparator 406 generates a Boolean output signal that transitions from low to high. This Boolean signal is applied to the MCU 402. To ensure proper voltage levels, both the MCU 402 and the FET 408 are coupled to a common source of reference potential (e.g. ground).

Figure 5:
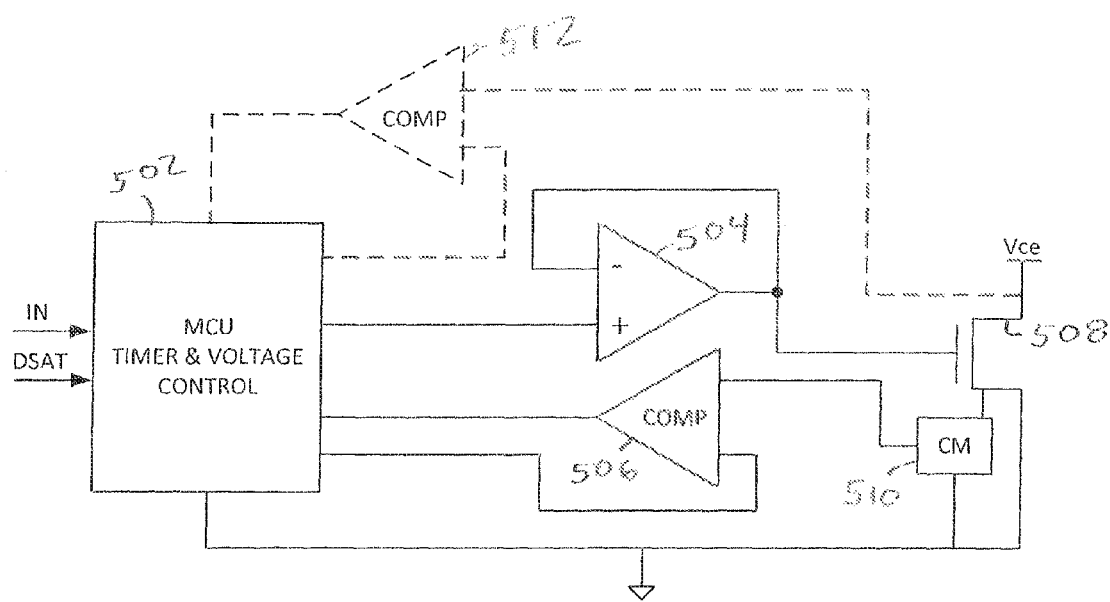
FIG. 5 is a schematic diagram of an example control circuit that controls switching based on Ic.
Figure 6:
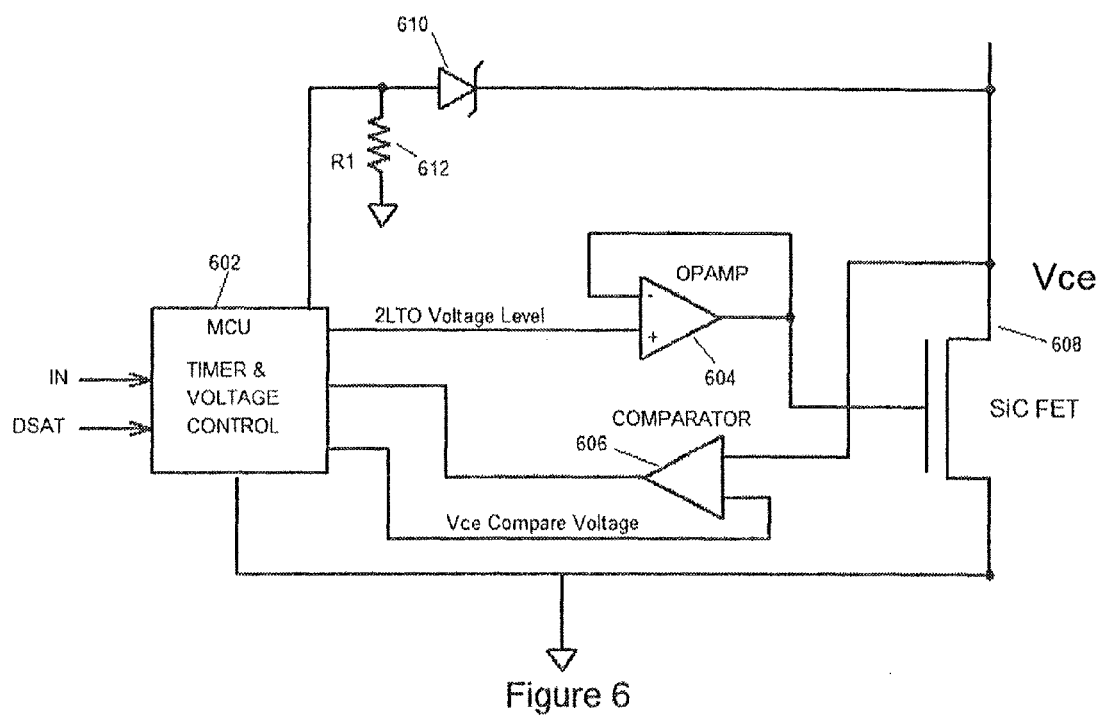
FIG. 6 is a schematic diagram of an example control circuit that controls switching based on Vce and includes a Vce overshoot monitor.

Although the circuits shown in FIGS. 4, 5 and 6 show a single comparator monitoring either Vce or Ic, it is contemplated that multiple comparators (not shown) may be used, one for each monitored voltage or current level. This may be desirable when the DAC used by the MCU cannot change the reference voltage on the comparator in time for the next transition. As described above, a separate comparator (not shown) may also be used to monitor Vce to detect a DSAT condition. This comparator would detect a voltage level greater than the normal on-level. The MCU may detect a DSAT condition when it has turned the power semiconductor device on and the output signal of the comparator indicates a voltage value greater than or equal to the DSAT voltage value.

In the examples described below, the MCU may be a programmable control unit including internal analog-to-digital converters (ADCs) and digital-to-analog converters (DACs) (not shown) that allow it to receive and provide analog output signals. Alternatively, the MCU may be implemented as an application specific integrated circuit (ASIC), a complex programmable logic device (CPLD), a field-programmable gate array (FPGA) or discrete control logic, each having or being coupled to ADCs and DACs to receive and provide the analog signals while performing the operations described below with reference to FIGS. 7 and 8. As another alternative, the MCU 402 and driver 404 may include circuitry such as the MCU, interface board and driver board of the system described in U.S. Pat. No. 8,984,197 entitled POWER STACK CONTROL SYSTEMS, by Charpentier et al. which is incorporated herein by reference.

In FIG. 4, the MCU 402 provides the VCE compare voltage to the comparator 406. This level is set by performing a characterization of the system to determine the optimal level to manage the size of the turn-off spike or the turn-on dI/dt for a particular application. It is desirable to determine this value for each circuit design as the inductance of each design may be different. For example the MCU may set the Vce turn-off level to 10V. Once a Vce level of 10V is achieved, 2LTOff time would stop and the MCU would apply a low(off) signal to the gate of the FET, causing the FET to turn off. As another example, for 2LTOn, the MCU may set the Vce comparator level to VCC-10V. Once Vce goes below that level, 2LTOn would stop and the MCU would cause the signal applied to the gate of the FET to transition to the on (high) level. Given that the voltage levels for power systems can be as high as 800V or more, it may be desirable to use an isolated comparator or level shift circuitry (not shown) to monitor the 2LToff and 2LTOn conditions separately. This allows the comparator to monitor, for example, a 2LTOn of VCC-10V with an isolated comparator output to the MCU.

Ic Monitoring

In certain IGBT and SiC devices the manufacturer provides a secondary output pin that is proportional to the main output current. This output pin may be, for example, the drain electrode of a smaller FET (not shown) having source and gate electrodes connected in parallel with the source and gate electrodes of the power FET in a current mirror configuration. This output pin allows the system to shunt the secondary current into a low-ohm resistor (not shown) coupled between the drain of the smaller FET and ground, to create a monitoring voltage that is a function of the total current through the FET. In some systems it is possible to use a shunt resistor in the main current output to create a measurable voltage that is used instead of the current mirror structure. The voltage output across the low-ohm resistor or shunt resistor is monitored by the comparator and when the voltage reaches the level applied by the MCU (e.g. 2LTOff or 2LTOn), the MCU drives the FET fully off or on.

An example Ice monitoring system is shown in FIG. 5. It includes an MCU 502 which may be the same as the MCU 402 shown in FIG. 4. The example system also includes an op-amp driver circuit 540 and a comparator 506 that may be the same as the op-amp 404 and comparator 406 shown in FIG. 4. The output signal of the driver 540 is coupled to the gate of the SiC FET 508. In this implementation, the TLTOn and TLTOff values and times would be set by the MCU based on the circuit design and the monitored current signal from the current mirror output CM of the FET or IGBT 508 in the same way as described above with reference to FIG. 4. FIG. 5 also includes comparator 512 (shown in phantom) that is coupled to receive Vce from the FET 508 and to receive a second reference value from the MCU 502. When comparator 512 is added to the controller, the controller may perform TLTOn, TLTOff or both based on Ic, Vce or both.

Real Time 2LTOff and 2LTOn Adjustment

This feature utilizes the amount of time that it takes for Vce or Ice to reach a level that trips the comparator. The time is monitored by the MCU by using the MCUs internal clock (digital timer set, counts down to zero). The timer "set" value is based on characterization of the IGBT or SiC FET device obtained through double pulse testing or other form of dynamic tests on the circuit that includes the IGBT or SIC FET.

An example system that makes this adjustment is shown in FIG. 6. The system includes an MCU 602, op-amp 604 and comparator 606 that otherwise operate in the same way as the MCU 402, op-amp 404 and comparator 406 shown in FIG. 4 except that, in FIG. 6, the MCU monitors ringing on the Vce signal and Vce voltage spikes to determine if the TLTOn or TLTOff values or times should be adjusted. The monitoring circuit includes the Zener diode 610 and resistor 612. If the time is too long or short then the MCU can adjust the 2LTOff or 2LTOn levels and/or times to force the FET to change state at a different voltage levels or at a different rate and thus optimize the overshoot, dI/dt and the efficiency of the switching characteristics.

This function uses the Zener diode 610 to first determine that Vce has crossed a level as defined by the breakdown of the Zener diode 610. The Zener diode is selected to have a breakdown voltage that is greater than Vce by an acceptable overshoot (spike or ringing) value. If the diode breaks down, a voltage develops across the resistor 612. This voltage means that overshoot is too high and the MCU either increases the 2LTOff level decrease the 2LTOff level, or increases the hold time. This modification may be made in steps to reduce the Vce overshoot to a level below the diode breakdown level.

Although the circuits shown in FIGS. 4-6 include an op-amp configured as a unity-gain amplifier as gate drive circuit, it is contemplated that the drive circuit may be eliminated or implemented using different technology. For example, the drive circuit may be implemented internal to the MCU such that the signal provided by the MCU conveys sufficient current to switch the gate of the FET or IGBT quickly. Alternatively, the op-amp may be replaced by another buffer amplifier, such as a push-pull amplifier.

In any of the circuits described above, the best 2LTOn and 2LTOff potentials to be used for a particular device may change based on the age or temperature of the FET or IGBT. To compensate for these changes, the MCU may include an internal clock that measures how long each power semiconductor device has been in use and may be coupled to a temperature sensor (e.g. a thermistor or thermocouple (not shown)) to determine the instantaneous temperature of the device. These values may be applied to a formula to adjust the 2LTOn and/or 2LTOff gate voltage values and delay times to compensate for age and/or temperature. The particular formula used is dependent on the structure and configuration of the power semiconductor device and may be determined empirically.

Figure 7:
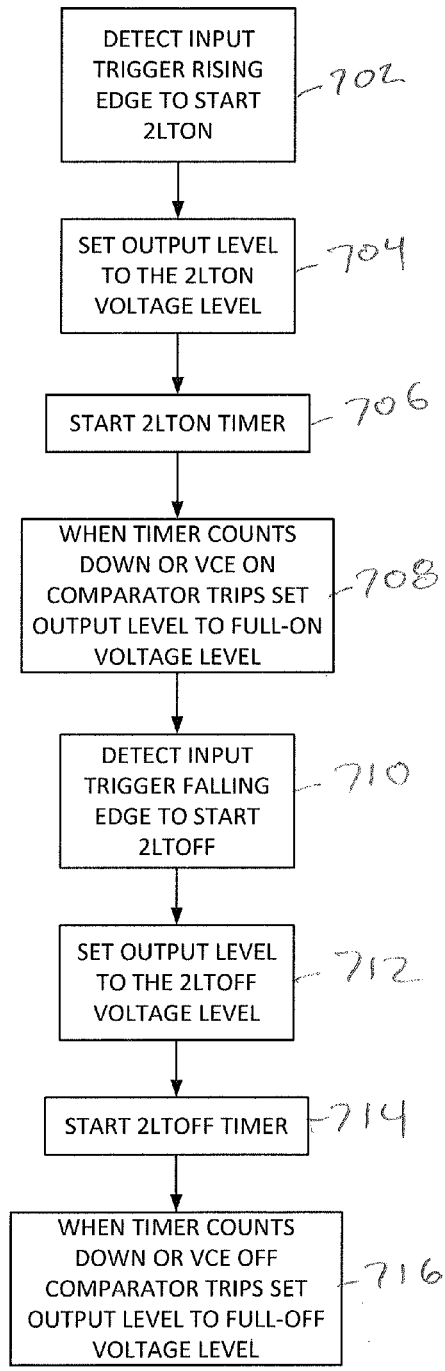
FIGS. 7 and 8 are flow-chart diagrams that are useful for describing the operation of the circuits shown in FIGS. 4, 5 and 6.
Figure 8:
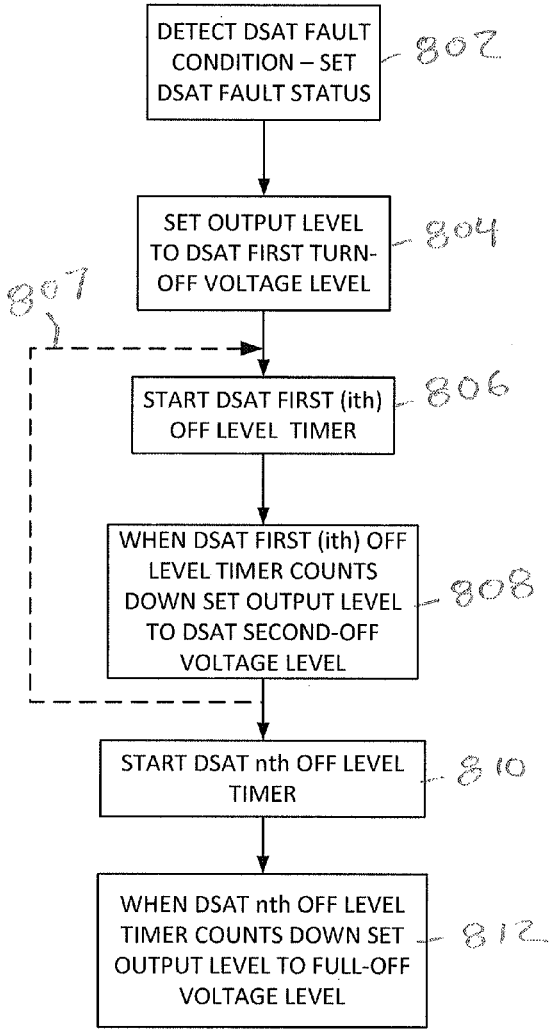

FIGS. 7 and 8 are flow-chart diagrams that illustrate examples of the operation of the MCU 402, 502 or 602 in the circuits shown in FIGS. 4, 5 and 6, respectively. FIG. 7 shows the operation of the systems in a 2LTO mode (both 2LTOff and 2LTOn) while FIG. 8 shows the operation of the system when a DSAT fault condition is detected. A DSAT condition may be detected by monitoring Ic in FIG. 5 to determine when the current through the FET or IGBT is excessive or experiences a sudden increase or by monitoring Vce for an on-state value that is higher than the on-state Vce value when the device is saturated or where the on-state Vce value exhibits a sudden increase.

In block 702, the MCU detects the rising edge of an input trigger on the input terminal IN. This signal indicates that the FET is to be turned on. Upon detecting this trigger, the MCU, at block 702, begins the 2LTOn operation by selecting the 2LTOn level and 2LTOn timer value. The MCU then applies the 2LTOn level to the gate electrode of the FET through the driver circuit. It also sets the reference value provided to the comparator to an intermediate Vce (or Ic) level which indicates that the FET may be turned on. At block 706, the MCU starts the 2LTOn timer. At block 706, when the timer expires (e.g. has counted down to zero), or when the comparator indicates that the Vce (or Ic) value has reached the reference level, the MCU sets the gate potential to the full-on (high) level.

At block 710, the MCU detects the falling edge of the input trigger IN to begin the turn-off operation. Also in block 710, the MCU selects a reference level and delay time that is appropriate for the 2LTOff operation. At block 712, the MCU causes the 2LTOff level to be applied to the gate electrode of the FET and sets the reference value applied to the comparator to an intermediate value of Vce (or Ic) which indicates that the FET may be turned off. At block 714 the MCU starts the 2LTOff timer. At block 716, when the timer expires, or when the comparator indicates that the Vce (or Ic) value has reached the reference level, the MCU sets the gate potential to the full-off (low).

FIG. 8 illustrates an example operation when a DSAT fault condition is detected. The algorithm shown in FIG. 8 may be used with the algorithm shown in FIG. 7 to provide a more aggressive turn-off operation when a DSAT condition is detected. At block 802, when the DSAT condition is detected, the MCU sets a DSAT status indicator which, in this example, causes a set of multi-level turn off (MLTOff) gate voltage values and corresponding delay times to be selected. At block 804, the MCU sets the signal applied to the gate electrode to the first turn-off gate voltage level and, as block 806 starts the timer to count-down the first delay time. At block 808, when the timer expires, the MCU sets the gate potential to the second (next) off voltage level. As shown by the arrow 807, blocks 806 and 808 may be repeated one or more times to accommodate multiple intervening levels. For each level, i, the ith timer is started at block 806 and when it counts down, block 806 sets the i+1$^{st}$ output level and delay values and branches to block 806. When the i+1$^{st}$ level is the same as the nth level, control passes to block 810. At block 810, once the MCU has selected the nth (last) off voltage level, the timer is started with the last delay value. At block 812, when the timer has counted down the last delay value, the MCU sets the gate potential of the FET or IGBT to the full-off voltage level.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A gate-drive controller for a power semiconductor device comprising:
a comparator having a reference input terminal, a signal input terminal, coupled to receive an output signal of the power semiconductor device, and an output terminal, the comparator providing a Boolean output signal that is in a first state when a value of a signal applied to the signal input terminal is less than a reference value applied to the reference input terminal and in a second state when the value of the signal applied to the signal input terminal is greater than or equal to the reference value applied to the reference input terminal;
a master control unit (MCU) having a first input terminal configured to receive a turn-off trigger signal, a second input terminal configured to receive the Boolean signal provided by the comparator, a third input terminal configured to receive a de-saturation (DSAT) signal, a first output terminal configured to provide a drive signal for the power semiconductor device and a second output terminal configured to provide the reference value to the reference input terminal of the comparator;
wherein the MCU includes program instructions that cause the MCU to:
generate a first intermediate drive signal for the power semiconductor device when the trigger signal indicates that the power semiconductor device is to be turned off;
generate a second intermediate drive signal, different from the first drive signal, when the DSAT signal indicates that the power semiconductor device is experiencing de-saturation; and
to generate a final drive signal for the power semiconductor when the Boolean signal indicates that the output signal from the power semiconductor device has changed.

2. The gate drive controller of claim 1 wherein the signal input terminal of the comparator is coupled to receive a voltage signal representing a voltage across the power semiconductor device and the program instructions cause the MCU to generate the final drive signal when the output signal of the power semiconductor is greater than the reference value.

3. The gate drive controller of claim 1 wherein the signal input terminal of the comparator is coupled to receive a voltage signal representing a current flowing through the power semiconductor device and the program instructions cause the MCU to generate the final drive signal when the output signal of the power semiconductor is less than the reference value.

4. The gate drive controller of claim 3 further comprising
a further comparator having further reference input terminal, a further signal input terminal coupled to receive a voltage signal representing the voltage across the power semiconductor device and a further output terminal, the further comparator providing a further Boolean output signal that changes state from a first value to a second value when the voltage across the semiconductor device becomes less than the value applied to the further reference input terminal;
wherein the program instructions further cause the MCU to generate the final drive signal when the Boolean signal indicates that the signal applied to the input terminal of the comparator is less than the reference value or when the further signal applied to the further input terminal of the further comparator is greater than the further reference value.

5. The gate drive controller of claim 1, wherein the program instructions further cause the MCU to set a timer to a first value when the first intermediate drive signal is generated and to set the timer to a second value with the second intermediate drive signal is generated and to cause the MCU to generate the final drive signal when the timer expires regardless of the state of the Boolean signal.

6. The gate drive controller of claim 1, further comprising a temperature sensor, coupled to provide a signal representing a temperature of the power semiconductor device to the MCU;
wherein the program instructions further cause the MCU to change the reference value in response to changes in the temperature of the power semiconductor device.

7. The gate drive controller of claim 1, wherein the power semiconductor device is selected from a group consisting of an silicon IGBT, a SiC FET, a GaN FET, an AlN FET and a BN FET.

8. A gate-drive controller for a power semiconductor device comprising:
a comparator having a reference input terminal, a signal input terminal, coupled to receive an output signal of the power semiconductor device, and an output terminal, the comparator providing a Boolean output signal that is in a first state when a value of a signal applied to the signal input terminal is less than a reference value applied to the reference input terminal and in a second state when the value of the signal applied to the signal input terminal is greater than or equal to the reference value applied to the reference input terminal;
a master control unit (MCU) having a first input terminal configured to receive a trigger pulse having a rising edge and a falling edge, a second input terminal configured to receive the Boolean signal provided by the comparator, a first output terminal configured to provide a drive signal for the power semiconductor device and a second output terminal configured to provide the reference value to the comparator;
wherein the MCU includes program instructions that cause the MCU to:
in response to detecting the rising edge of the trigger pulse, generate a first reference value and a first drive signal for the power semiconductor device, the first drive signal tending to turn the power semiconductor device partially on;
generate a second drive signal for the power semiconductor device when the Boolean signal changes between the first state and the second state, wherein the second drive signal tends to turn the power semiconductor device completely on;
in response to the falling edge of the trigger pulse, generate a second reference value and a third drive signal for the power semiconductor device, the third drive signal tending to turn the power semiconductor device partially off;
generate a fourth drive signal for the power semiconductor device when the Boolean signal changes between the second state and the first state, the fourth drive signal tending to turn the power semiconductor device completely off.

9. The gate drive controller of claim 8 wherein the signal input terminal of the comparator coupled to receive a voltage signal representing a voltage across the power semiconductor device and the program instructions cause the MCU to generate the fourth drive signal when the output signal of the power semiconductor is greater than the reference value.

10. The gate drive controller of claim 8 wherein the signal input terminal of the comparator is configured to receive a voltage signal representing a current flowing through the power semiconductor device and the program instructions cause the MCU to generate the fourth drive signal when the output signal of the power semiconductor is less than the reference value.

11. The gate drive controller of claim 10 further comprising
a further comparator having further reference input terminal, a further signal input terminal coupled to receive a voltage signal representing the voltage across the power semiconductor device, the further comparator providing a further Boolean output signal that is in a first state when a value of a voltage signal applied to the further signal input terminal is less than the further value applied to the further reference input terminal and in a second state when the value of the voltage signal applied to the signal input terminal is greater than or equal to the further value applied to the further reference input terminal;
wherein the program instructions further cause the MCU to
generate the second drive signal when either the Boolean signal or the further Boolean signal changes between the first state and the second state; and
generate the fourth drive signal when either the Boolean signal or the further Boolean signal changes between the second state and the first state.

12. The gate drive controller of claim 8, wherein the program instructions further cause the MCU to:
set a timer to a first value when the first drive signal is generated;
generate the second drive signal when the timer expires regardless of the state of the Boolean signal;
to set the timer to a second value when the third drive signal is generated; and
generate the fourth drive signal when the timer expires regardless of the state of the Boolean signal.

13. The gate drive controller of claim 8, further comprising a temperature sensor, coupled to provide a signal representing a temperature of the power semiconductor device to the MCU;
wherein the program instructions further cause the MCU to change at least one of the first and second reference values in response to changes in the temperature of the power semiconductor device.

14. The gate drive controller of claim 8, wherein the power semiconductor device is selected from a group consisting of an silicon IGBT, a SiC FET, a GaN FET, an AlN FET and a BN FET.

15. The gate drive controller of claim 8, including a further comparator, having a further reference input terminal, a further signal input terminal, coupled to receive the output signal of the power semiconductor device, and a further output terminal, the further comparator providing a further Boolean output signal that is in a first state when a value of a signal applied to the further signal input terminal is less than a reference value applied to the further reference input terminal and in a second state when the value of the signal applied to the further signal input terminal is greater than or equal to the reference value applied to the further reference input terminal; and the program instructions cause the MCU to apply the first reference value to the comparator and the second reference value to the further comparator and to generate the fourth drive signal when the further Boolean signal changes between the second state and the first state.

* * * * *